(12) United States Patent
Ha

(10) Patent No.: US 7,190,142 B2
(45) Date of Patent: Mar. 13, 2007

(54) APPARATUS AND METHOD FOR CONTROLLING FAN DRIVE IN COMPUTER SYSTEM

(75) Inventor: Chang Jin Ha, Suwon-si (KR)

(73) Assignee: LG Electronics Inc., Seoul (KR)

( * ) Notice: Subject to any disclaimer, the term of this patent is extended or adjusted under 35 U.S.C. 154(b) by 349 days.

(21) Appl. No.: 10/811,850

(22) Filed: Mar. 30, 2004

(65) Prior Publication Data

US 2005/0013114 A1 Jan. 20, 2005

(30) Foreign Application Priority Data

Jul. 14, 2003 (KR) ...................... 10-2003-0047855

(51) Int. Cl.
*G05B 11/28* (2006.01)
*G06F 1/20* (2006.01)

(52) U.S. Cl. ...................... 318/599; 318/268; 318/477; 236/49.3; 361/687; 361/688

(58) Field of Classification Search ...................... None
See application file for complete search history.

(56) References Cited

U.S. PATENT DOCUMENTS

| | | | | |
|---|---|---|---|---|
| 5,249,741 A * | 10/1993 | Bistline et al. | ............ | 236/49.3 |
| 5,563,480 A * | 10/1996 | Okada | ...................... | 318/254 |
| 5,687,079 A * | 11/1997 | Bauer et al. | ...................... | 700/70 |
| 5,727,928 A * | 3/1998 | Brown | ...................... | 417/44.11 |
| 5,777,897 A * | 7/1998 | Giorgio | ...................... | 700/299 |
| 5,942,866 A * | 8/1999 | Hsieh | ...................... | 318/268 |
| 6,011,371 A * | 1/2000 | Van Brocklin et al. | ...... | 318/471 |
| 6,188,189 B1 * | 2/2001 | Blake | ...................... | 318/471 |
| 6,243,656 B1 * | 6/2001 | Arai et al. | ...................... | 702/132 |
| 6,385,395 B1 * | 5/2002 | Horng et al. | ................ | 388/809 |
| 6,392,372 B1 * | 5/2002 | Mays, II | ...................... | 318/254 |
| 6,470,289 B1 * | 10/2002 | Peters et al. | ................ | 702/132 |
| 6,601,168 B1 * | 7/2003 | Stancil et al. | ............... | 713/100 |
| 6,778,938 B1 * | 8/2004 | Ng et al. | ...................... | 702/147 |
| 6,874,327 B1 * | 4/2005 | Wahler et al. | ................ | 62/178 |
| 6,919,703 B2 * | 7/2005 | Marando et al. | ............. | 318/599 |
| 6,933,697 B2 * | 8/2005 | Marando et al. | ............. | 318/599 |
| 6,935,130 B2 * | 8/2005 | Cheng et al. | ............... | 62/259.2 |
| 6,989,955 B2 * | 1/2006 | Ziemer et al. | ................ | 360/75 |
| 7,069,172 B2 * | 6/2006 | Bekker et al. | ............... | 702/145 |
| 2002/0140389 A1 * | 10/2002 | Ohki et al. | .................. | 318/471 |
| 2003/0137267 A1 * | 7/2003 | Blake | ........................ | 318/471 |
| 2003/0193307 A1 * | 10/2003 | Burstein | ..................... | 318/473 |
| 2003/0201741 A1 * | 10/2003 | Lee | ............................ | 318/268 |

(Continued)

*Primary Examiner*—Lincoln Donovan
*Assistant Examiner*—Robert W. Horn
(74) *Attorney, Agent, or Firm*—KED & Associates, LLP

(57) ABSTRACT

Embodiments of an apparatus and method can control a fan drive in a computer system. Such embodiments of apparatus and methods can alternately output a plurality of pulse width modulation (PWM) control signals at a predetermined time ratio and variably control a rotation speed of a cooling fan. The embodiments can use simple hardware based upon N-bit resolution in a PWM control signal generator included in the computer system for controlling the rotation speed of the cooling fan decreasing an internal temperature, such that the rotation speed of the cooling fan can be precisely and variably controlled, equally with the effect of an operation for controlling the fan drive using hardware based upon resolution of more than the N bits. Further, a physical configuration can be effectively simplified, and unnecessary power consumption can be reduced or prevented.

28 Claims, 9 Drawing Sheets

U.S. PATENT DOCUMENTS

| | | | |
|---|---|---|---|
| 2004/0001542 A1* | 1/2004 | Miller, Jr. | 375/238 |
| 2004/0232869 A1* | 11/2004 | Marando et al. | 318/599 |
| 2004/0257013 A1* | 12/2004 | Chhleda et al. | 318/268 |
| 2004/0263105 A1* | 12/2004 | Tsai et al. | 318/471 |
| 2005/0013114 A1* | 1/2005 | Ha | 361/687 |
| 2005/0040779 A1* | 2/2005 | Frankel et al. | 318/268 |
| 2005/0240316 A1* | 10/2005 | Mayer | 700/300 |
| 2006/0013571 A1* | 1/2006 | Squibb | 388/804 |
| 2006/0181232 A1* | 8/2006 | Oljaca et al. | 318/268 |

* cited by examiner

FIG. 3
(Related Art)

*4bits-Resolution PWM Control Signals Generator*

| Steps | PWM Control Signals (PWM Patterns) | Motor Speeds (RPM) |
|---|---|---|
| Step 0 | PWM Pattern 0 | 0 (min) |
| Step 1 | PWM Pattern 1 | 300 |
| Step 2 | PWM Pattern 2 | 600 |
| Step 3 | PWM Pattern 3 | 900 |
| Step 4 | PWM Pattern 4 | 1200 |
| ⋮ | ⋮ | ⋮ |
| Step 11 | PWM Pattern 11 | 3300 |
| Step 12 | PWM Pattern 12 | 3600 |
| Step 13 | PWM Pattern 13 | 3900 |
| Step 14 | PWM Pattern 14 | 4200 |
| Step 15 | PWM Pattern 15 | 4500 (max) |

FIG. 5

*Information of Steps of 8 bits-Resolution and Motor Speeds*

| Steps | Motor Speeds (RPM) |
|---|---|
| Step 0 | 0 (min) |
| Step 1 | 18.75 |
| Step 2 | 37.5 |
| ⋮ | ⋮ |
| Step 176 | 3300 |
| ⋮ | ⋮ |
| Step 187 | 3506.25 |
| ⋮ | ⋮ |
| Step 192 | 3600 |
| ⋮ | ⋮ |
| Step 240 | 4500 |
| ⋮ | ⋮ |
| Step 255 | 4781.25 (max) |

Fan Power Off

Fan Power On

APPARATUS AND METHOD FOR CONTROLLING FAN DRIVE IN COMPUTER SYSTEM

BACKGROUND OF THE INVENTION

1. Field of the Invention

The present invention relates to an apparatus and method for controlling a fan drive in various computer systems such as a notebook computer, a personal computer and etc

2. Background of the Related Art

FIG. 1 is a block diagram illustrating the configuration of a conventional computer system. Various computer systems such as a notebook computer, a personal computer and etc. include a central processing unit (CPU) 10, a video controller 11, a north bridge 12, a random access memory (RAM) 13, a hard disk drive (HDD) 14, a south bridge 15, a thermal sensor 16, a microcomputer 17, a cooling fan module 18, etc.

Further, the south bridge 15 is equipped with a power manager (PM) 150 for managing system power. The microcomputer 17 is equipped with a pulse width modulation (PWM) control signal generator 170 for variably controlling a rotation speed of a cooling fan.

The thermal sensor 16 detects an internal temperature of a computer varying with heat from, for example, the CPU 10, the HDD 14 or etc., and outputs a signal indicating the detected temperature to the PM 150 located within the south bridge 15. The PWM control signal generator 170 located within the microcomputer 17 generates a PWM control signal adapted to the detected temperature and outputs the generated PWM control signal to the cooling fan module 18.

In response to the PWM control signal, the cooling fan module 18 performs an operation for incrementing or decrementing the rotation speed of a cooling fan through a plurality of stepped speeds. As shown in FIG. 2, the cooling fan module 18 includes a motor drive 180, a motor 181 and a cooling fan 182.

The motor drive 180 applies, to the motor 181, a drive voltage corresponding to the PWM control signal outputted from the PWM control signal generator 170 so that the cooling fan 182 can be rotated at a predetermined rotation speed in response to the drive voltage. The PWM control signal generator 170 generates a PWM control signal for rotating the cooling fan 182 at a high speed where the internal temperature detected by the thermal sensor 16 is relatively high. On the other hand, the PWM control signal generator 170 generates a PWM control signal for rotating the cooling fan 182 at a low speed where the internal temperature detected by the thermal sensor 16 is relatively low.

The PWM control signal generator 170 can use, for example, hardware based upon 4-bit resolution as shown in FIG. 3. In this case, 16 PWM control signals (PWM PATTERNS 0~15) are present so that the rotation speed of the cooling fan 182 can vary by 16 STEPS (0~15).

Further, where the minimum and maximum rotation speeds of the cooling fan 182 are set to "0" RPM (Revolutions Per Minute) and "4500" RPM, respectively, a rotation speed difference of the cooling fan 182 between consecutive steps becomes "300" RPM. Assuming that the optimum rotation speed of the cooling fan 182 necessary for reducing the internal temperature of the computer is "3500" RPM, the PWM control signal generator 170 outputs a PWM control signal PWM PATTERN 12 corresponding to "3600" RPM, which is the PWM pattern closest to "3500" RPM.

As described above, the related art computer system and method have various disadvantages. For example, the cooling fan 182 was rotated at "3600" RPM according to the PWM control signal PWM PATTERN 12 because it was the closest to "3500" RPM of the PWM patterns shown in FIG. 3. In this case, the cooling fan 182 is unnecessarily rotated by an additional "100" RPM, and hence power is wasted. In the case of the notebook computer, a battery available time is reduced because of the unnecessary rotation. Further, as the cooling fan 182 is unnecessarily rotated, noise can be incurred.

To address the above problems, the PWM control signal generator 170 can use hardware based upon a higher predetermined bit resolution, for example, hardware based upon 8-bit resolution. However, the hardware based upon the 8-bit resolution is more expensive to install, control and manage than that based upon the 4-bit resolution. Where the hardware based upon the 8-bit resolution is used, there are problems in that a size of the hardware is increased and that it is difficult for the computer system to be simplified.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide an apparatus and method for controlling a device in a computer system that can output a plurality of control signals and combine the two or more of the control signals to control the device.

Another object of the present invention is to provide an apparatus and method for controlling a fan drive in a computer system that can output a plurality of pulse width modulation (PWM) control signals and combine the two or more of the PWM control signals to variably control a rotation speed of a cooling fan.

Another object of the present invention is to provide an apparatus and method for controlling a fan drive in a computer system that can output a plurality of pulse width modulation (PWM) control signals at a predetermined time ratio and variably control a rotation speed of a cooling fan.

Another object of the present invention is to provide an apparatus and method for controlling a fan drive in a computer system that can output a plurality of pulse width modulation (PWM) control signals and variably control a rotation speed of a cooling fan using a combination of the PWM control signals to reduce power consumption while decreasing an internal temperature of the computer system.

Another object of the present invention is to provide an apparatus and method for controlling a fan drive in a computer system that can output a plurality of pulse width modulation (PWM) control signals based on a N-bit resolution and variably control a rotation speed of a cooling fan with a resolution greater than N-bits.

In order to achieve at least the above objects and advantages in a whole or in part, in accordance with one aspect of the present invention there is provided a computer system that includes a cooling fan configured to adjust an internal temperature of the computer system, a pulse width modulation (PWM) control signal generator configured to control a rotation speed of the cooling fan according to the internal temperature of the computer system, wherein the PWM control signal generator is configured to generates first resolution PWM control signals, and a controller configured to control the PWM control signal generator to output a combination of different first resolution PWM control signals.

To further achieve at least the above objects and advantages in a whole or in part, in accordance with one aspect of the present invention there is provided an apparatus for controlling a fan drive in a computer system including a cooling fan that includes pulse width modulation (PWM) control signal generation unit for adjusting a rotation speed of the cooling fan according to an internal temperature of the computer system, the PWM control signal generation unit generating PWM control signals corresponding to steps of first resolution, and control unit for controlling the PWM control signal generation unit, the control unit referring to information of steps of second resolution higher than the first resolution to control the PWM control signal generation unit to alternately output a plurality of different PWM control signals at a predetermined time ratio, the different PWM control signals corresponding to said steps of the first resolution.

To further achieve at least the above objects and advantages in a whole or in part, in accordance with one aspect of the present invention there is provided a method for controlling a fan drive in a computer system that includes determining a rotation speed of a cooling fan correlated to control an internal temperature of the computer system, selecting at least two first resolution PWM control signals corresponding to the determined rotation speed from among the first resolution PWM control signals, and outputting a combination of said at least two first resolution PWM control signals to control said rotation speed.

To further achieve at least the above objects and advantages in a whole or in part, in accordance with one aspect of the present invention there is provided an article including a machine-readable storage medium containing instructions for operating a computer system, the instructions, when executed, causing the computer system to identify second resolution driving patterns higher than first resolution driving patterns to select one second resolution driving pattern for a device, select two first resolution driving patterns with a prescribed relationship to the selected second resolution driving pattern from among the first resolution driving patterns, and output control signals for the device corresponding to the selected two first resolution driving patterns at a predetermined time ratio according to the selected second resolution driving pattern.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3 is a table illustrating exemplary pulse width modulation (PWM) patterns outputted from a related art PWM control signal generator based upon 4-bit resolution and fan drive speeds;

FIG. 5 is a table illustrating exemplary information associated with 256 steps based upon 8-bit resolution and fan rotation speeds corresponding to the 256 steps in accordance with the present invention;

DETAILED DESCRIPTION OF PREFERRED EMBODIMENTS

Figure 1:
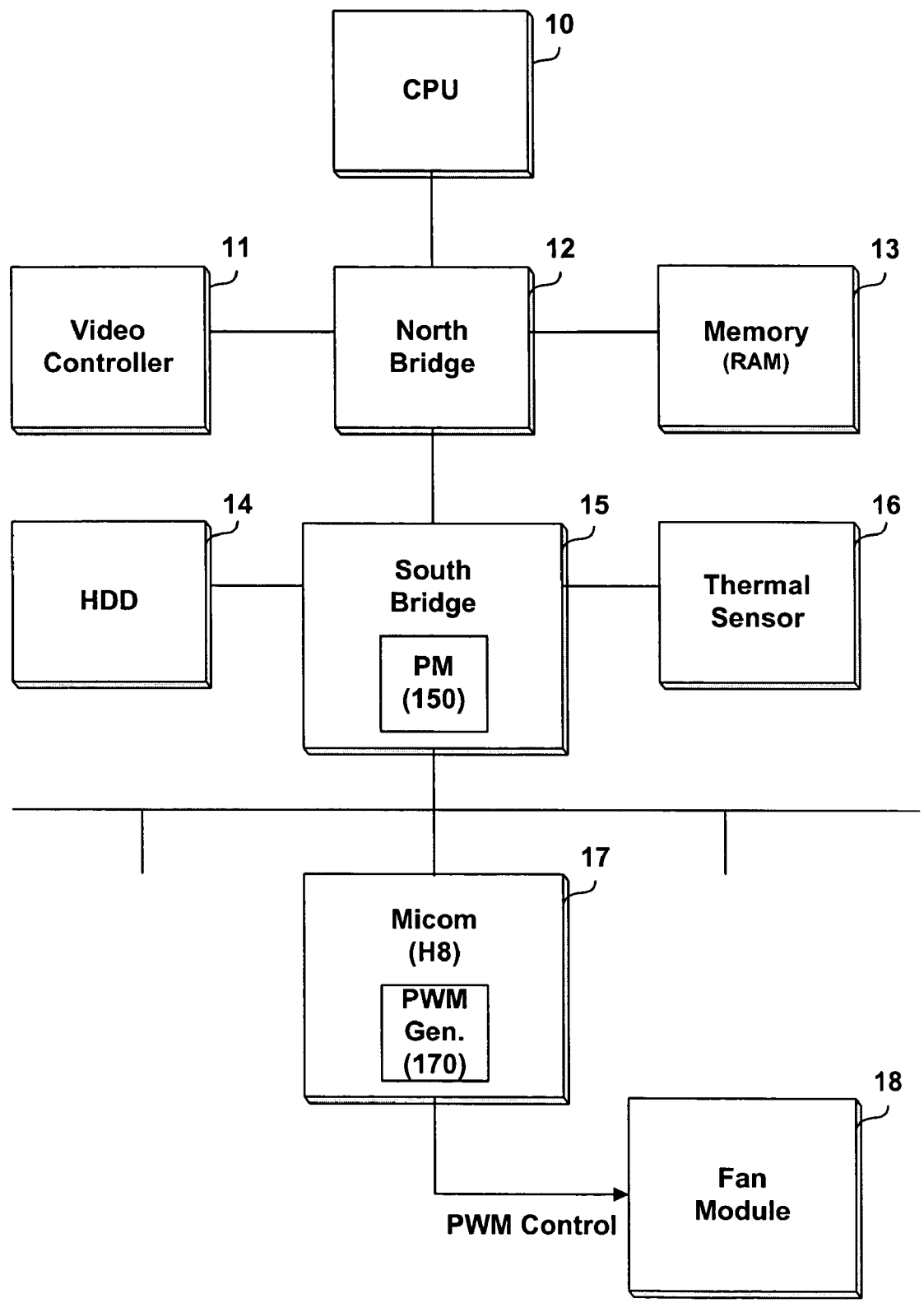
FIG. 1 is a block diagram illustrating the configuration of a related art computer system.
Figure 2:
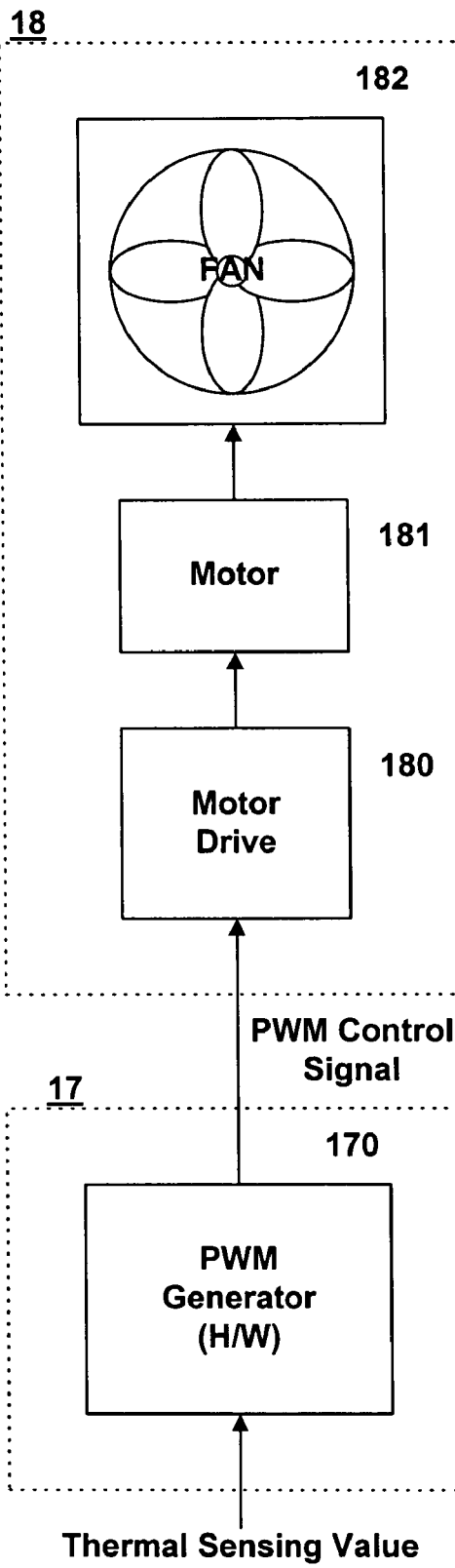
FIG. 2 is a block diagram illustrating the partial configuration of an apparatus for controlling a fan drive in the related art computer system.
Figure 4:
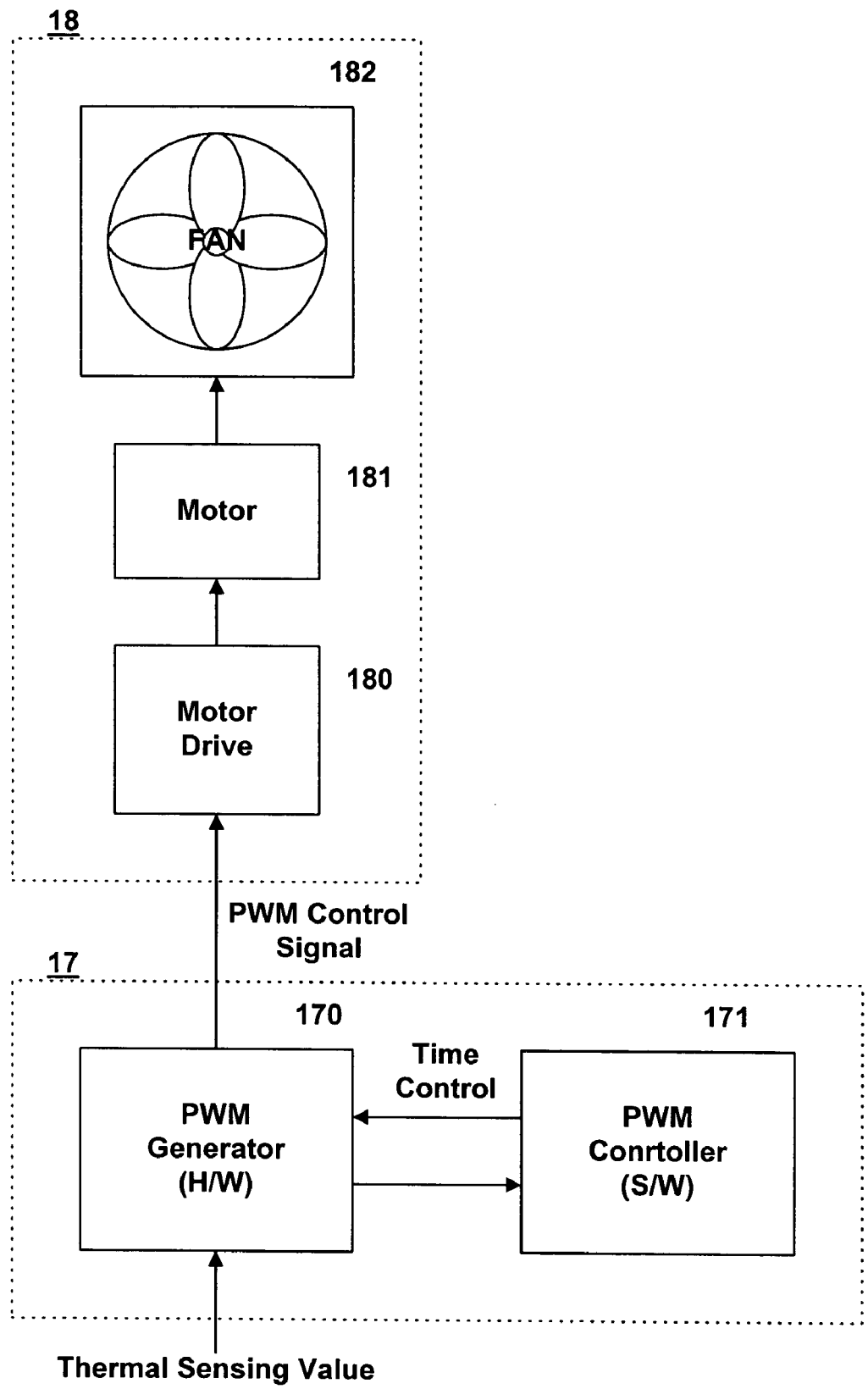
FIG. 4 is a block diagram illustrating a partial configuration of a preferred embodiment of an apparatus for controlling a fan drive in a computer system in accordance with the present invention.

Embodiments of apparatus and methods for controlling the fan drive can be applied to various computer systems such as a notebook computer, a personal computer, etc. The embodiments of apparatus and methods for controlling fan speed in accordance with the present invention can be applied to portable computers configured by the components of FIG. 1 and will be described using the components shown in the computer system of FIG. 1. For example, a microcomputer 17 embedded in a computer system can be constituted by hardware (H/W) of a pulse width modulation (PWM) control signal generator 170 and software (S/W) of a PWM controller 171 as shown in FIG. 4. However, the present invention is not intended to be so limited.

As shown in FIG. 4, the hardware of the PWM control signal generator 170 can generate PWM control signals (e.g., PWM PATTERNS 0~15 at 16 STEPS 0~15) of N-bit resolution, for example, the 4-bit resolution described with reference to FIG. 3. The software of the PWM controller 171 preferably manages 256 steps of 8-bit resolution and a cooling fan's rotation speed information corresponding to the 256 steps for example, that is stored as exemplary information (e.g., virtual information) in a table shown in FIG. 5.

In the virtual information, the low or minimum rotation speed of the cooling fan associated with STEP 0 can be set to "0" RPM (Revolutions Per Minute). The rotation speed of the cooling fan associated with STEP 240 of the 8-bit resolution corresponding to STEP 15 of the 4-bit resolution can be set to "4500" RPM. In this case, the cooling fan's rotation speed difference between the steps of the 8-bit resolution can be precisely set to "18.75" RPM, and the high or maximum rotation speed corresponding to STEP 255 can be set to "4781.25" RPM. However, the present invention is not intended to be so limited. For example, the minimum step need not be set to zero RPM, and further, a non-linear relation can define the intervals between steps.

Figure 6:
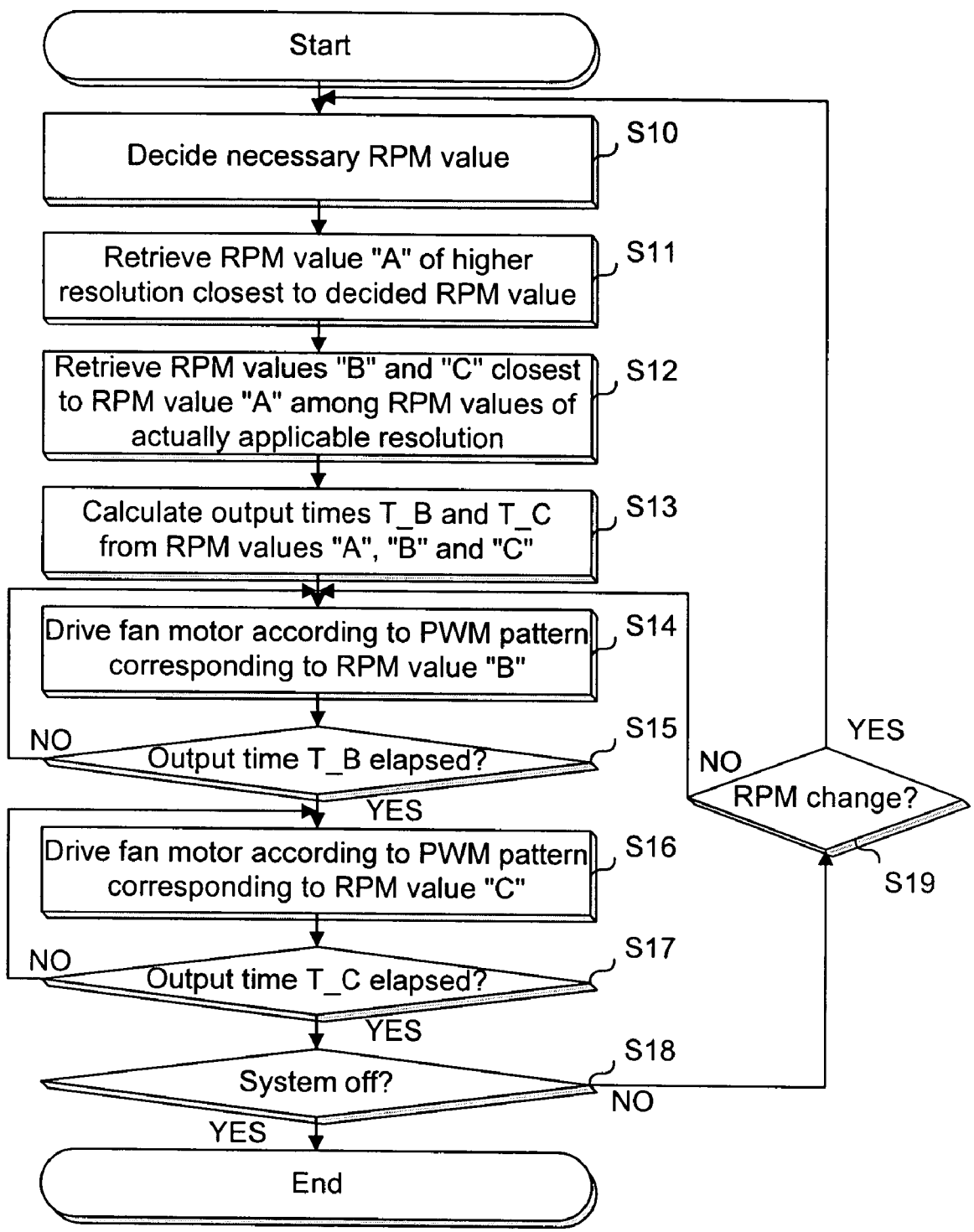
FIG. 6 is a flow chart illustrating a preferred embodiment of a method for controlling a fan drive in the computer system in accordance with the present invention.

FIG. 6 is a flow chart illustrating an embodiment of a method for controlling a fan drive in the computer system in accordance with the present invention. As shown in FIG. 6, the method can be applied to and will be described using the apparatus shown in FIG. 4. However, the present invention is not intended to be so limited.

As shown in FIG. 6, after a process start, the PWM controller 171 can decide the cooling fan's desired or optimum rotation speed (e.g., RPM) or determined rotation speed necessary to reduce an internal temperature of the computer according to the internal temperature of the computer detected by a thermal sensor (block S10). For example, assuming that the optimum rotation speed is "3500" RPM, "A=3506.25 RPM" is retrieved from the virtual information as an RPM value closest (e.g., and preferably higher) to 3500 RPM among RPM values of the steps of the 8-bit resolution of FIG. 5 (block S11).

After the PWM controller 171 confirms STEP 187 linked to "A=3506.25 RPM", the PWM controller 171 can retrieve two RPM values of "B=3300 RPM" and "C=3600 RPM" closest to "A=3506.25 RPM" from among RPM values corresponding to the steps of the 4-bit resolution (e.g., N-bit resolution) actually applicable in the PWM control signal controller 170 (block S12).

The steps (e.g., two PWM patterns) corresponding to "B=3300 RPM" and "C=3600 RPM" are determined to be STEP 11 and STEP 12 of the 4-bit resolution, respectively, or are determined to be STEP 176 and STEP 192 of the 8-bit resolution, respectively. A step difference between STEP 187 and STEP 176 and a step difference between STEP 187 and STEP 192 are preferably calculated on the basis of the 8-bit resolution.

According to the calculations of the step differences, the step difference between STEP 187 and STEP 176 is "11" and the step difference between STEP 187 and STEP 192 is "5". On the basis of the calculated step differences, there can be calculated times required for alternately outputting PWM control signals PWM PATTERN 11 of STEP 11 and PWM PATTERN 12 of STEP 12 of the 4-bit resolution corresponding to STEP 176 and STEP 192 of the 8-bit resolution. The times required for alternately outputting the PWM control signals PWM PATTERN 11 and PWM PATTERN 12 are preferably inversely proportional to the step differences between STEP 187 and STEP 176 and between STEP 187 and STEP 192 associated with the 8-bit resolution. A ratio of the times required for alternately outputting the PWM control signals PWM PATTERN 11 and PWM PATTERN 12 is calculated as "5:11". When an interval (e.g., "1 msec") much shorter than a period corresponding to a response speed of the cooling fan is set as a basic unit of the time required for outputting each pattern, the time required for outputting both selected PWM patterns can be determined. For example, the time required for outputting the PWM control signal PWM PATTERN 11, e.g., T_B, is 5×1 msec=5 msec, and time required for outputting the PWM control signal PWM PATTERN 12, e.g., T_C, is 11×1 msec=11 msec (block S13).

However, the present invention is not intended to be so limited. For example, alternative calculations can be used to determine absolute and/or relative times for two or more PWM patterns or non-adjacent PWM patterns of the lower resolution (e.g., 4-bit) from a selected RPM.

Figure 7:
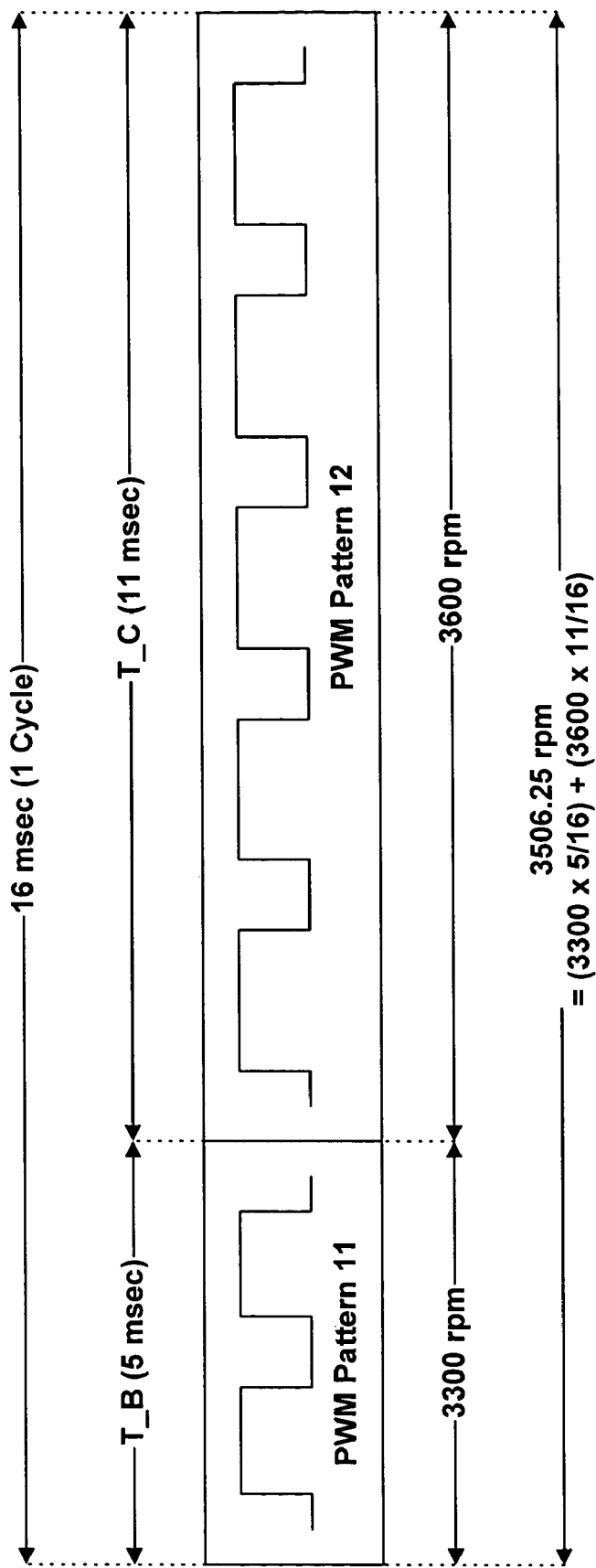
FIG. 7 is a timing diagram illustrating an exemplary PWM control signal variably outputted by in the computer system in accordance with an embodiment of the present invention.

The PWM controller 171 can control the PWM control signal generator 170, for example, as shown in FIG. 7, so that the PWM control signal PWM PATTERN 11 corresponding to "B=3300 RPM" can be outputted for 5 msec being T_B (blocks S14 and S15), and the PWM control signal PWM PATTERN 12 corresponding to "C=3600 RPM" can be outputted for 11 msec being T_C (blocks S16 and S17). Thus, one period can be "T_B+T_C=16 msec", and the PWM control signals PWM PATTERN 11 and PWM PATTERN 12 are preferably alternately outputted during the one period (blocks S14 to S17).

Thus, in the above-described example, the PWM control signal corresponding to "3300" RPM is inputted into the cooling fan module 18 for 5 msec, and the PWM control signal corresponding to "3600" RPM is inputted into the cooling fan module 18 for 11 msec. The effect of the PWM control signals corresponding to "3300" RPM and "3600" RPM inputted for 16 msec can be substantially equal to that of the PWM control signal corresponding to "3506.25" RPM inputted for 16 msec. Therefore, although the PWM control signal generator of the lower resolution (e.g., 4-bit resolution) is used as it is, the effect or operations of the PWM control signal generator of the higher resolution (e.g., 8-bit resolution) can be obtained.

Where the rotation speed of the cooling fan must be changed to another RPM value rather than "3500 RPM" as the internal temperature of the computer increases or decreases, the PWM controller 171 can newly or repeatedly perform the above-described blocks S10 to S17. Where the rotation speed of the cooling fan does not need to be changed, only the above-described blocks S14 to S17 can be repeatedly performed (block S19). The above-described operations can be continuously performed until the system is in an OFF state (block S18).

Figure 8:
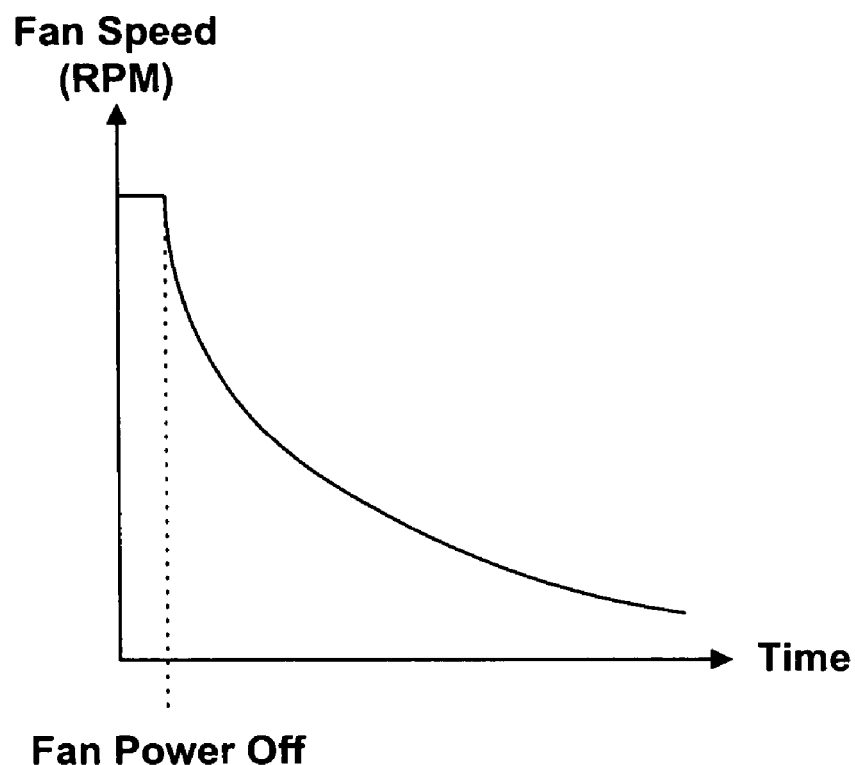
FIGS. 8 and 9 are graphs illustrating the relationship between a rotation speed of a fan drive motor and power.
Figure 10:
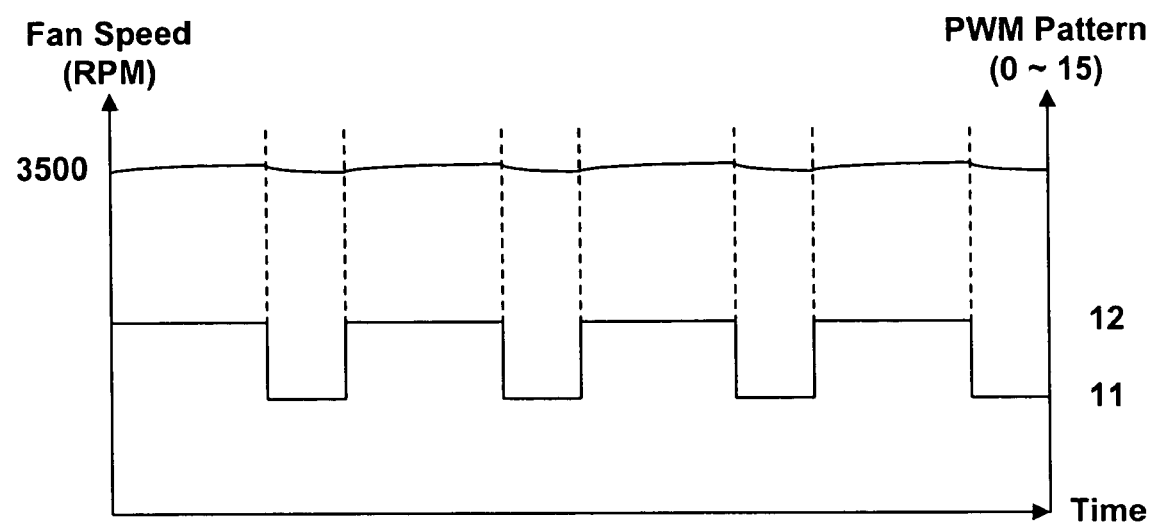
FIG. 10 is a graph illustrating PWM control signals (PWM patterns) alternately outputted by the fan drive control method in the computer system and the motor's actual rotation speeds in accordance with preferred embodiments of the present invention.

Since the response speed of a fan motor is relatively slow as exemplarily shown in FIG. 8, the fan motor is not instantly stopped when power to be applied to the fan motor is in an OFF state. Instead, a speed of the fan motor is slowly decreased by the force of inertia. Further, although the PWM control signals of different patterns can be alternately inputted as shown in FIG. 10, because the fan motor cannot instantly respond to an input varying in a period of 16 msec, the drive speed of the fan motor is almost constant and can be stably adjusted.

Figure 9:
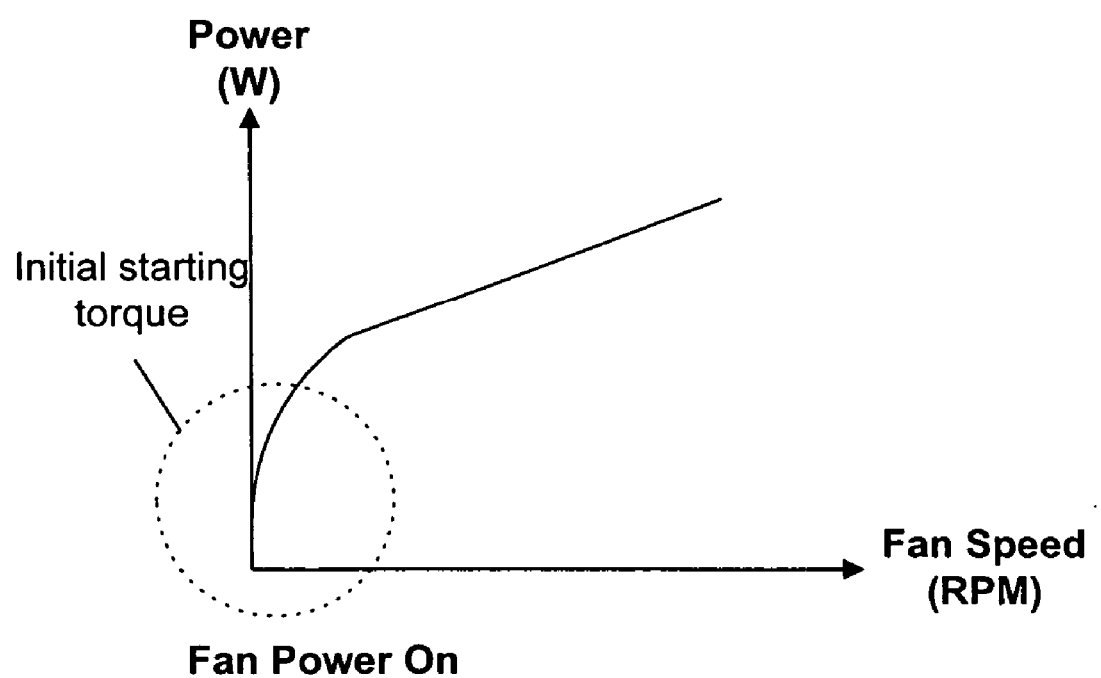

As shown in FIG. 9, consumption power of the fan motor is increased as the drive speed of the fan motor is increased. Thus, unnecessary power consumption can be reduced or prevented if the fan drive speed can be appropriately and precisely controlled.

As described above, embodiments according to the present invention were described in relation to a cooling fan of a computer system. However, the present invention is not intended to be so limited. For example, embodiments according to the present invention can be applied to other devices of the computer system including, but not limited to, a display lamp of a display or driving mechanism (e.g., inverter) for the same.

Various software or firmware layers based upon a module or routine format containing application programs, operating system modules, device drivers, BIOS modules and interrupt handlers can be stored in at least one storage medium provided in the computer system. The applicable storage media can include hard disc drives, compact discs (CDs) or digital versatile discs (DVDs), floppy discs, nonvolatile memories, system memories and the like. The modules, routines or other layers stored in the storage medium contain instructions for allowing the convertible computer system to execute programmed acts when executed.

The software or firmware layers can be loaded on the system by one of various methods. For example, code segments are stored in floppy discs, CD or DVD discs or hard discs, or code segments transported through a network interface card, modem or other interface devices can be loaded on the system and can be executed by a corresponding software or firmware layer. In the loading or transporting process, the code segments and data signals carried by a carrier (through a telephone line, a network line, a radio link, a cable, etc.) can be sent to the system.

As described above, embodiments of apparatus and methods configured to control a device of a computer system have various advantages. Embodiments according to the present invention can provide an apparatus and method for controlling a fan drive in a computer system that can precisely and variably control a rotation speed of a cooling fan using given resolution of hardware substantially equally with the effect of an operation for controlling the fan drive using hardware based upon resolution higher than the given resolution. Further, embodiments according to the present invention can efficiently simplify a physical configuration, and can prevent unnecessary power consumption.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A computer system, comprising:
   a cooling fan configured to adjust an internal temperature of the computer system;
   a pulse width modulation (PWM) control signal generator configured to control a rotation speed of the cooling fan according to the internal temperature of the computer system, wherein the PWM control signal generator is configured to generates first resolution PM control signals; and
   a controller configured to control the PWM control signal generator to output a combination of different first resolution PWM control signals, wherein the controller selects one second resolution PWM control signals corresponding to a selected rotation speed of the cooling fan, wherein the second resolution control signals are higher resolution than the first resolution PWM control signals, and wherein the combination of different first resolution PWM control signals approximates the selected resolution signal.

2. The computer system of claim 1, wherein the combination of different first resolution PWM control signals is output in a single driving cycle of the fan.

3. The computer system of claim 2, wherein the driving cycle is 16 milliseconds.

4. The computer system of claim 1, wherein the combination of different first resolution PWM control signals are alternate sequential first resolution PWM control signals at a predetermined time ratio.

5. The computer system of claim 1, wherein the PWM control signal generator is configured by hardware, and wherein the controller is configured by software.

6. The computer system of claim 1, wherein the combination of different first resolution PWM control signals are alternately outputted and each are selected as two of the first resolution PWM signal having rotation speeds closest to the corresponding rotation speed of the cooling fan corresponding to the selected second resolution PWM control signal.

7. The computer system of claim 6, wherein the corresponding two first resolution PWM control signals are alternately outputted according to the predetermined time ratio calculated on the basis of step differences between two steps of the second resolution corresponding to the selected the two steps of the first resolution and the selected one step of the second resolution, the step differences being calculated on the basis of the steps of the second resolution.

8. The computer system of claim 7, wherein the predetermined time ratio is proportional to reciprocal numbers of the calculated step differences.

9. The computer system of claim 1, wherein a period in which said plurality of different PWM control signals of the first resolution are alternately outputted is shorter than a period corresponding to a response speed of the cooling fan.

10. An apparatus for controlling a fan drive in a computer system including a cooling fan, comprising:
    pulse width modulation (PWM) control signal generation means for adjusting a rotation speed of the cooling fan according to an internal temperature of the computer system, the PWM control signal generation means generating PWM control signals corresponding to steps of first resolution; and
    control means for controlling the PWM control signal generation means, the control means referring to information of steps of second resolution higher than the first resolution to control the PWM control signal generation means to alternately output a plurality of different PWM control signals at a predetermined time ratio, the different PWM control signals corresponding to said steps of the first resolution, wherein the control means selects one step corresponding to a selected rotation speed of the cooling fan from the information of the steps of the second resolution, wherein the combination of the different PWM control signals in the predetermined time ratio approximates the selected one step of the second resolution.

11. The apparatus of claim 10, wherein the PWM control signal generation means is configured by hardware, and wherein the control means is configured by software.

12. The apparatus of claim 10, wherein said steps whose PWM control signals are alternately outputted are selected as two steps of the first resolution having rotation speeds closest to the rotation speed of the cooling fan corresponding to the selected one step of the second resolution.

13. The apparatus of claim 12, wherein the PWM control signals corresponding to the selected two steps of the first resolution are alternately outputted according to the predetermined time ration calculated on the basis of step differences between two steps of the second resolution corresponding to the selected two steps of the first resolution and the selected one step of the second resolution, the step differences being calculated on the basis of the steps of the second resolution.

14. The apparatus of claim 13, wherein the predetermined time ratio is proportional of reciprocal numbers of the calculated step differences.

15. The apparatus of claim 10, wherein a period in which said plurality of different PWM control signals of the first resolution are alternately outputted is shorter than a period corresponding to a response speed of the cooling fan.

16. A method for controlling a fan drive in a computer system, comprising:
    determining a rotation speed of a cooling fan correlated to control an internal temperature of the computer system;

selecting at least two first resolution PWM control signals corresponding to the determined rotation speed from among the first resolution PWM control signals; and outputting a combination of said at least two first resolution PWM control signals to control said rotation speed.

17. The method of claim 16, comprising identifying a second higher resolution PWM control signal corresponding to the determined cooling fan rotation speed, and wherein the determined rotation is information closest to an desired rotation speed of the cooling fan among the information of the steps of the second resolution.

18. The method of claim 17, wherein said at least two first resolution PWM control signals are output at a predetermined time ratio, wherein the predetermined time ratio is calculated on the basis of step differences between two steps of the second resolution corresponding to the selected two steps of the first resolution and a step of the second resolution having the determined rotation speed, the step differences being calculated on the basis of the steps of the second resolution.

19. The method of claim 18, wherein the predetermined time ratio is proportional to reciprocal numbers of the calculated step differences.

20. The method of claim 16, wherein a period in which said at least two first resolution PWM signals are alternately outputted is shorter than a period corresponding to a response speed of the cooling fan.

21. An article including a machine-readable storage medium containing instructions for operating a computer system, the instructions, when executed, causing the computer system to:

identify second resolution driving patterns higher than first resolution driving patterns to select one second resolution driving pattern for a device;

select at least two first resolution driving patterns with a prescribed relationship to the selected second resolution driving pattern from among the first resolution driving patterns; and generate a driving pattern for driving the device that approximates the selected second resolution driving pattern using a combination of the selected at least two first resolution driving patterns at a predetermined time ratio.

22. The article of claim 21, wherein the first and second driving patterns correspond to PWM control signals and the device is a cooling fan.

23. The article of claim 21, wherein the device is a cooling fan, wherein the driving patterns correspond to rotation speeds of the cooling fan, and wherein a designated rotation speed of the cooling fan corresponds to the selected second resolution driving patterns.

24. The article of claim 23, wherein the predetermined time ratio is calculated on the basis of step differences between two steps of the second resolution driving patterns corresponding to the selected two first resolution driving patterns and a step of the second resolution having the confirmed rotation speed, the step differences being calculated on the basis of the steps of the second resolution.

25. The article of claim 24, wherein the predetermined time ratio is proportional to reciprocal numbers of the calculated step differences.

26. The article of claim 21, wherein a period in which PWM control signals corresponding to the selected two steps are alternately outputted is shorter than a period corresponding to a response speed of a cooling fan by a predetermined ratio.

27. The article of claim 21, wherein the device is an illuminating lamp of a display.

28. The article of claim 21, wherein the instructions, when executed, cause the computer system to:

drive the device using the combination of selected at least two first resolution driving patterns.

* * * * *